(12) United States Patent
Kelly et al.

(10) Patent No.: US 8,575,544 B1
(45) Date of Patent: Nov. 5, 2013

(54) METHODS AND DEVICES FOR IMPROVING ATOM PROBE DETECTOR PERFORMANCE

(75) Inventors: Thomas F. Kelly, Madison, WI (US); Daniel R. Lenz, Stoughton, WI (US); Scott A. Wiener, Mount Horeb, WI (US)

(73) Assignee: Cameca Instruments, Inc., Madison, WI (US)

( * ) Notice: Subject to any disclaimer, the term of this patent is extended or adjusted under 35 U.S.C. 154(b) by 126 days.

(21) Appl. No.: 13/053,790

(22) Filed: Mar. 22, 2011

Related U.S. Application Data

(60) Provisional application No. 61/316,184, filed on Mar. 22, 2010.

(51) Int. Cl.
*H01J 49/40* (2006.01)

(52) U.S. Cl.
USPC .......... 250/287; 250/281; 250/282; 250/286; 250/288

(58) Field of Classification Search
USPC ................. 250/281, 282, 286, 287, 288, 289
See application file for complete search history.

(56) References Cited

U.S. PATENT DOCUMENTS

| 5,381,001 A | 1/1995 | Perryman et al. | |
|---|---|---|---|
| 2008/0128608 A1* | 6/2008 | Northen et al. | 250/282 |
| 2009/0261243 A1* | 10/2009 | Bamberger et al. | 250/287 |

OTHER PUBLICATIONS

Annunziata et al., 2006, Superconducting niobium nanowire single photon detectors, *Advanced Photon Counting Techniques*, edited by Wolfgang Becker, *Proc. of SPIE*, vol. 6372, 8 pages.

Annunziata et al., 2008, Niobium superconducting nanowire single-photon detectors, pp. 1-5.

Bock et al., 2009, Superconducting Detector Arrays for Far-Infrared to mm-Wave Astrophysics, Jet Propulsion Laboratory, California Institute of Technology.

Casaburi et al., 2009, Subnanosecond time response of large-area superconducting stripline detectors for keV molecular ions, *Applied Physics Letters* 94, 212502-1 to 212502-3.

Ejrnaes et al., 2009, Large Signal Amplitude and Bias Range of Cascade Switch Superconducting Nanowire Single Photon Detectors, *IEEE Transactions on Applied Superconductivity* 19, No. 3, Part 1, pp. 323-326.

Estey et al., 2009, Time-of-Flight Mass Spectrometry With Latching Nb Meander Detectors, *IEEE Transactions on Applied Superconductivity*, vol. 19, No. 3, pp. 382-385.

Friedrich et al., 1998, Superconducting Tunnel Junction Array Development for High-Resolution Energy-Dispersive X-Ray Spectroscopy, *Microscopy and Microanalysis Conference*, Atlanta, GA, 14 pages.

(Continued)

*Primary Examiner* — Robert Kim
*Assistant Examiner* — Hanway Chang
(74) *Attorney, Agent, or Firm* — Craig A. Fieschko, Esq.; DeWitt Ross & Stevens S.C.

(57) ABSTRACT

An atom probe includes a detector which registers the time of flight of ions evaporated from a specimen, as well as the positions on the detector at which the ions impact and the kinetic energies of the ions. The detected position allows the original locations of the ions on the specimen to be mapped, and the times of flight and kinetic energies can be spectrally analyzed (e.g., binned into sets of like values) to determine the elemental identities of the ions. The use of kinetic energy data as well as time of flight data can allow more accurate identification of composition than where time of flight data are used alone, as in traditional atom probes.

25 Claims, 8 Drawing Sheets

(56) References Cited

OTHER PUBLICATIONS

Friedrich, Superconducting Tunnel Junction Photon Detectors: Theory and Applications, *Advances Detector Group, Lawrence Livermore National Laboratory*, Livermore, CA, 10 pages.

Frunzio et al., 2001, Improved energy resolution of x-ray single photon imaging spectrometers using superconducting tunnel junctions, *Journal of Applied Physics*, vol. 90, No. 7, pp. 3645-3647.

Frunzio et al., 2003a, Quasiparticle nonequilibrium dynamics in a superconducting Ta film, *Journal of Applied Physics*, vol. 93, No. 2, pp. 1137-1141.

Frunzio et al., 2003b, Physical Properties of the Superconducting Ta Film Absorber of an S-Ray Photon Detector, *IEEE Transactions on Applied Superconductivity*, vol. 13, No. 2, pp. 1124-1127.

Furlan et al., 2008, Imaging of single infrared, optical, and ultraviolet photons using distributed tunnel junction readout on superconducting absorbers, *Laboratory for Astrophysics, Paul Scherrer Institute*, Switzerland, 7 pages.

Hunter, 1998, of Josephson Junctions, Quasi-particles, and Cooper Pairs, 7 pages.

Kurakado et al., 1991, Superconductive radiation detector with large sensitive area (series-connected STJ detector), *Rev. Sci. Instrum.*, 62(1), pp. 156-162.

Marsili et al., 2008, High efficiency NbN nanowire superconducting single photon detectors fabricated on MgO substrates from a low temperature process, *Optics Express*, vol. 16, No. 5, pp. 3191-3196.

Martin et al., 2000, Matrix readout scheme for superconducting tunnel junction arrays, *review of Scientific Instruments*, vol. 71, No. 9, pp. 3543-3551.

Moskovets et al., 1992, Mass-Reflectron as an Ion Energy Analyzer, *Appl. Phys.*, B54, pp. 556-561.

Oosterbroek et al., 2007, A practical correction method for pile up observed in STJ detectors, *Journal of Low Temperature Physics*, 6 pages.

Poelaert, 1971, Superconducting Tunnel Junctions Used As Photon Detectors, 163 pages.

Prober et al., 2006, Quasiparticle dynamics and a new, high-resolution readout of STJ photon detectors, *Nuclear Instruments and Methods in Physics Research A* 559, pp. 676-679.

Savu, 2007, The Light at the End of the Tunnel Junction—Improving the Energy Resolution of UV Single-Photon Spectrometers using Diffusion Engineering, Yale University, 109 pages.

Szymkowiak et al., 1989, High resolution microcalorimeters as detectors for inelastic scattering (invited), *Rev. Sci. Instrum.*, 60(7), pp. 1557-1560.

Verhoeve et al., 2003, Quasiparticle loss rates in Ta-based superconducting tunnel junctions, *10th International Workshop on Low Temperature Detectors*, Genoa Italy, 1 page.

Verhoeve et al., S-Cam 3: optical astronomy with a STJ-based imaging spectrophotomer, *Elsevier Science*, pp. 1-4.

Westmacott et al., 1999, Ion Detection with a Cryogenic Detector Compared to a Microchannel Plate Detector in MALDI TOF-MS, UCRL-JC-134740 Preprint, 14 pages.

Zen et al., 2009, 1 mm ultrafast superconducting stripline molecule detector, *Applied Physics Letters* 95, pp. 172508-1 to 172508-3.

\* cited by examiner

METHODS AND DEVICES FOR IMPROVING ATOM PROBE DETECTOR PERFORMANCE

CROSS-REFERENCE TO RELATED APPLICATIONS

This application claims the benefit of U.S. Provisional Patent Application No. 61/316,184, filed Mar. 22, 2010, entitled METHODS AND DEVICES TO IMPROVE PARTICLE DETECTOR PERFORMANCE, which is incorporated herein by reference in its entirety.

FIELD OF THE INVENTION

The invention is related generally to methods and devices to utilize position- and energy-sensitive detectors to improve the performance of time-of-flight (TOF) mass spectrometers, and more particularly atom probes.

BACKGROUND OF THE INVENTION

An atom probe (e.g., atom probe microscope) is a device which allows specimens to be analyzed on an atomic level. A typical atom probe includes a specimen mount, a counter or local electrode with a small aperture (approximately 50 microns in diameter), and a detector. During analysis, a specimen is carried by the specimen mount and a positive electrical potential (e.g., a standing or baseline voltage) is applied to the specimen. A microchannel plate (MCP) coupled to a delay line is typically used as a detector by converting ions into electrons. The counter electrode is located between the specimen and the detector, and is either grounded or negatively charged. An excitation pulse such as a positive electrical pulse (above the baseline voltage), a laser pulse (e.g., photonic energy), and/or another form of energy pulse (e.g., electron beam or packet, ion beam, RF pulse, etc.) is periodically applied to the specimen at regular time intervals, or at irregular or varying intervals depending on the application. Alternatively or additionally, a negative electrical pulse can be periodically applied to the electrode. Occasionally (e.g., one time in 10 to 100 pulses) a single atom is ionized near the tip of the specimen. The ionized atom(s) separate from the surface of the specimen via a mechanism known as "field evaporation", pass though the aperture in the electrode, and impact the surface of the detector. The elemental identity of an ionized atom can be determined by measuring its time of flight (TOF), the time between the pulse that liberates the ion from the surface of the specimen and the time it impinges on the detector. The velocity of the ions (and thus their TOF) varies based on the mass-to-charge-state ratio (m/n) of the ionized atom, with lighter and/or more highly charged ions taking less time to reach the detector. Since the TOF of an ion is indicative of the mass-to-charge ratio of the ion, which is in turn indicative of elemental identity, the TOF can help identify the composition of the ionized atom. In addition, the location of the ionized atom on the surface of the specimen can be determined by measuring the location of the atom's impact on the detector. Thus, as the specimen is evaporated, a three-dimensional map or image of the specimen's constituent atoms can be constructed. The image is that of a point projection, with atomic resolution and a magnification of over 1 million, depending on aperture size, specimen tip radius, and ion flight distance, among other parameters.

The atom probe typically includes cryogenic cooling devices. Cooling of the specimen is useful to reduce thermal motion at the atomic level that can result in positional errors in the data collected. Specimen temperatures on the order of 20 to 50 K are often used.

The probability of ionization from the specimen tip is an exponential function of both voltage and temperature, and thus the specimen ionization probability can be raised from effectively zero to a very high value in a very short time with the application of appropriate energy (e.g., excitation pulses). The time that the specimen spends in a state of high ionization probability is ideally extremely small so that the time of departure of the ion would be precisely known. A highly accurate measurement of the TOF to the detector could then be obtained, and the corresponding mass-to-charge-state ratio—often referred to as m/n, where m is the ion mass and n is the charge state (+1, +2, +3, etc.) of the ion—could be determined with high precision.

The measure of the peak width in a mass spectrum is often called the "mass resolving power" (m/Δm) of the atom probe and is one of the most important metrics by which atom probe performance is measured. (Alternatively, mass resolution, the inverse of mass resolving power is often used.) Devices with higher mass resolving power can discern individual m/n peaks, hence individual ions, better than those with poorer mass resolving power.

Commercially available MCP detector systems commonly utilized in atom probe microscopes typically fail to detect numerous ions evaporated from specimens, and tend to operate at about 60% efficiency. The efficiency is limited by a number of factors including MCP pore density and charging effects, to name a few. They also lack energy resolution (or have very poor energy resolution), i.e., they fail to impart any meaningful information about received ions/particles. Only recently have CsI coated MCP's operating well below the saturation voltage yielded limited energy resolution, but only in the soft X-ray region.

Typical atom probes can also have difficulty distinguishing between events on the detector that are due to a) intrinsic atoms (or molecules) that originate from inside the analyzed volume of the specimen, b) extrinsic atoms (or molecules) that originate from outside the analyzed volume of the specimen, and c) noise. A distinction is made here between discrete and collective discrimination. Discrete discrimination is defined as the ability to discern the identity of each individual ion in a data set. In Atom Probe Tomography (APT), discrete discrimination is required for imaging so that each ion in the data set may be correctly assigned an identity. An example of the importance of discrete discrimination is shown in FIG. 6. The very low oxygen signal can be masked by the tail of silicon signals in the mass spectrum. Therefore, when a mass range at oxygen is displayed, a significant fraction of it can in fact be silicon from the tail of the silicon peak because the discrete signals cannot be discriminated in an image. Collective discrimination is defined as the ability to discern, as a fraction of some group, the identity of each subgroup. Collective discrimination would be accomplished, for example, by decomposition of a single unresolved peak or overlapping peaks into their constituents using deconvolution or isotopic distribution information. The usual practice in atom probe tomography is to report compositions in particular volumes. Collective discrimination is important for determination of composition within these volumes.

SUMMARY OF THE INVENTION

The invention, which is defined by the claims set forth at the end of this document, is directed to atom probe devices and methods with enhanced discrimination abilities, and/or having other advantages discussed below. A basic understanding of some of the features of preferred versions of the invention can be attained from a review of the following brief summary of the invention, with more details being provided elsewhere in this document. To assist in the reader's understanding, the following review makes reference to the accompanying drawings (which are briefly reviewed in the "Brief Description of the Drawings" section following this Summary section of this document).

An atom probe, such as the local electrode atom probe of FIG. 3, includes a specimen mount configured to receive a specimen thereon, and to also supply the specimen with energy that is at least partially sufficient to evaporate (ionize) atoms from the specimen. (Throughout this document, it should be understood that when evaporation of specimen "atoms" is discussed, this is also intended to include molecules, since in some cases molecules—e.g., diatomic gas molecules—will evaporate rather than single atoms.) Such ionization energy can also be provided by the local electrode. This energy is preferably provided during ionization periods spaced in time, e.g., in energy pulses periodically spaced at regular or irregular time intervals. A detector is spaced from the specimen (and local electrode), and has its area oriented to receive ions from the specimen. The detector, which is preferably at least partially superconducting, is configured to provide a detector output encoding (i.e., providing output signals representative of) the arrival time at which the ions are received on the detector (and thus encoding ion time of flight between the specimen and detector), the arrival location on the area of the detector on which the ions are received, and the kinetic energy of the ions. For example, an appropriately configured superconducting detector, e.g., one or more layers of a superconducting material such as NbN which each have an insulating layer thereon, will generate a burst of quasiparticles at a location where an ion strike occurs. The location of the event indicates ion arrival location, its timing is indicative of ion time of flight, and its magnitude is indicative of kinetic energy. These data can then be used for several purposes.

Initially, compositional information such as elemental identity can be derived from the time of flight data, the kinetic energy data, or preferably both (and "elemental" identity should be understood to encompass molecular identity where molecules are at issue). Time-of-flight data can yield ion mass-to-charge-state ratios, which are indicative of elemental identity. Similarly, kinetic energy measurements can yield ion charge states, which can help resolve ambiguities for ions having the same or similar mass-to-charge-state ratios but having different charges (and thus different masses). A particularly preferred approach is to form a two-dimensional spectrum of data representative of time of flight, and data representative of kinetic energy, with the two-dimensional spectrum allowing more accurate discrimination of peaks (and thus elements) than would either dimension taken alone. Furthermore, data that does not fit well within a peak can be deemed to be "noise" generated by spurious ions/atoms adrift within, or otherwise dislodged from locations within, the specimen chamber. Alternatively, such data can be analyzed to see whether any ion strikes are actually simultaneous (or nearly simultaneous) strikes of multiple ions, which can be identified by their times of flight being at least substantially identical to individual ions of the same species, but having kinetic energies which are some multiple of individual ions of the same species (e.g., two ions of the same species which impinge on the detector simultaneously, or nearly so, will impart twice the kinetic energy as a single ion impact). The data from the multiple strikes can then be decomposed into data for the individual ions.

Further, the ion arrival locations on the detector can be used to derive the locations on the specimen from which the ions originated, i.e., the spatial locations of the ions on the specimen can be determined based on the image that they projected onto the detector. This can be done, for example, by monitoring outputs at multiple sides of the area of the detector to determine the times at which each monitored side receives a signal from the ion arrival location. The time delay between signal receipts at each side can allow the ion arrival location to be triangulated, or otherwise determined in a manner similar to triangulation. In similar respects, a signal could be supplied to the detector, and the sides of the detector can be monitored for changes in the signal. Since an ion strike on a superconductor can cause a momentary change in impedance/conductivity (as well as causing the aforementioned quasiparticle emissions), signal disruptions or reflections can similarly be triangulated to determine ion strike locations.

The foregoing ion compositional and locational data can then be provided to users in a variety of forms, perhaps most usefully in the form of a visual representation of the specimen, showing the locations of the ions in the specimen (e.g., as points mapped in three dimensions) and their elemental identities (e.g. by color-coding the points).

The ability to identify ions by use of both their time of flight and kinetic energy signatures also allows analyses that would be difficult, if not impossible, to attain in conventional atom probes. As an example, a small amount of gas might be supplied to the specimen chamber, such that during specimen evaporation (and more particularly between the time-spaced ionization periods), the gas can be field ionized about the surface of the specimen. The detector can then receive the gas ions and form an image of the specimen surface, as in conventional Field Ion Microscopy (FIM). However, FIM was previously regarded as being incompatible with Atom Probe Tomography (APT), particularly because of the difficulties with differentiating between specimen ions (which tend to be synchronized with the ionization periods) and gas ions (which tend to lack synchronization with the ionization periods). Because the two-dimensional time of flight and kinetic energy spectrum provides higher discriminating power, the specimen ions can be more readily identified as intrinsic, and the extrinsic gas ions can be used solely for the spatial/imaging information they provide.

Further advantages, features, and objects of the invention will be apparent from the remainder of this document in conjunction with the associated drawings.

DETAILED DESCRIPTION OF EXEMPLARY VERSIONS OF THE INVENTION

Figure 1:
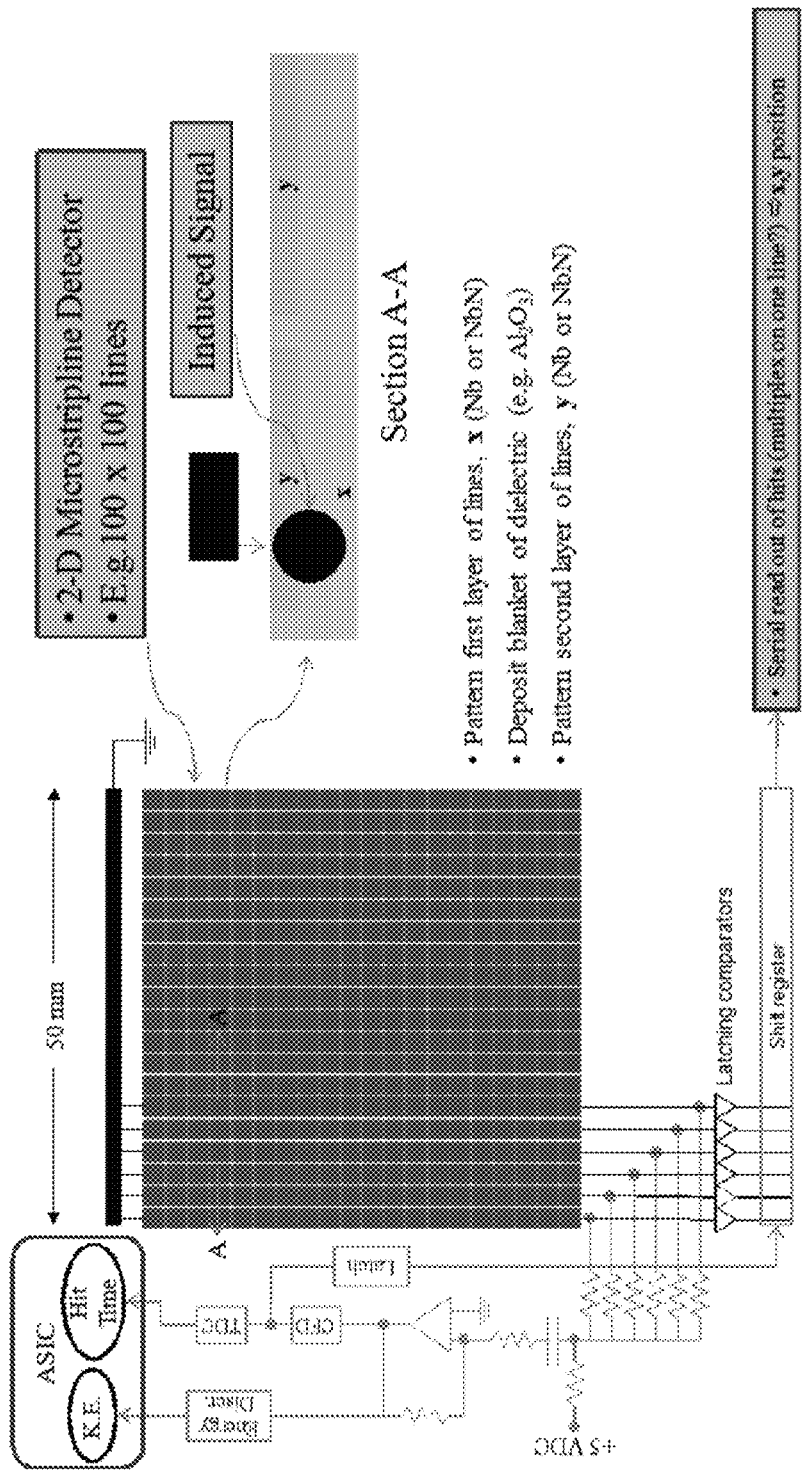
FIG. 1 is a partially schematic representation of a Superconductor Detector with an ion inducing a signal in a region in an x, y array.

As discussed above, preferred versions of the invention utilize a superconducting detector (SD) as a detector in an atom probe. Metallic superconductors have properties that make them useful for ion detection. Principally, when energetic particles impact a superconductor, the deposited energy can break apart Cooper-paired electrons. Because the binding energy of Cooper pairs in metals is about 2 meV, a 10 keV ion can create millions of broken pairs of electrons (or holes) known as quasiparticles. These quasiparticles are free electrons/holes in the superconductor that have distinct behavior from Cooper pairs. The number of quasiparticles is proportional to the incoming (kinetic) energy of the ion, and thus the ion's kinetic energy—which is indicative of its charge state (as discussed below)—can be measured. The time scale for this process is a few tens of picoseconds, which is fast enough for time-of-flight measurements in an atom probe. Thus, there is amplification of the incoming ion event/signal that is large enough to satisfy the need for kinetic energy and TOF measurement.

However, challenges remain with detection of the location of ion impacts (which, as noted above, effectively indicate the original location of the ionized atom before it evaporated from the specimen). In the past, SDs such as superconducting nanostripline detectors (SSLDs), superconducting tunnel junctions (STJs), superconducting quantum interface devices (SQUIDs), normal-insulator-superconductor (NIS) microcalorimeters, and the like have been used to detect ions in TOF mass spectrometers. However, these SDs are generally utilized for either photon counting, or for very large molecular weight TOF application (i.e. in the range of thousands of Daltons, rather than the hundreds of Dalton operating range preferred for atom probes). In these cases, only the TOF and/or pulse amplitude of the detected particle or photon were typically recorded, and no position data was obtained. Thus, the original position of the ion on the surface of the specimen is indeterminate, and no imaging of the specimen occurs.

As discussed below, there are a number of ways to determine the incident ion hit position using a SD, including (but not limited to) direct sensing (as in an x, y array), propagation delay sensing (as with a delay line), optical imaging (as with a CCD camera or the like), and/or interpolating the hit position by comparing one or more outputs to some baseline signal. In some cases, these techniques can be combined; for example, a direct sensing device could be coupled to a propagation sensing device, and the resultant signal(s) could be used to determine position. The incident ion could generate a localized signal and the position could be interpolated.

In one version of the invention, the SD can be patterned to yield position information. An example is an array of sensors or sensing materials, say in an x, y configuration, and/or in a configuration functionally equivalent to a delay line. Each individual element of the array of sensors could serve as an input to a detection circuit such as an amplifier or microwave transmitter. The signal from each line of the sensor array could be interrogated, and the individual $x_n$, $y_n$ position could be interpolated.

In an example of this version of the invention, the SD (e.g. Nb or NbN) could be deposited on sapphire (Al2O3), silicon (Si) or other appropriate material. This would in turn be deposited on another SD material (a.k.a. "the bottom") and each SD layer could include some readout means. If "the top" SD was configured in an array of lines in one direction (say x) and "the bottom" SD was configured in another direction (say y), and the ion generated a signal on an x row and a y row then the x, y position could be interpolated. Each line could be connected to a readout device, such as an amplifier or a microwave transmission line (FIG. 1).

In another version of the invention the signal can be induced or coupled to the SD and changes in the electrical or thermal properties of the SD sub-region can be sensed. As an example, a sinusoidal signal (e.g. a continuous wave or the like) is transmitted into (or onto) a SD and the signal caused by the localized energy deposition of the incident ion is sensed. With no ion 'hits', the sensed signal(s) should be relatively constant. When an ion hits the SD the energy transfer can create localized quasiparticles, or even a localized normal zone or "hot spot", thus changing the impedance of the region. Note that the rise time of a signal generated by the formation of quasiparticles is on the order of tens to hundreds of picoseconds, whereas the rise time of a normal zone signal is on the order of microseconds. This change in impedance can cause a change in the sensed signal(s), similar to a pebble landing in a body of water. Rows of sensors can be used to interpolate where the ion impinged on the SD (FIG. 2), much like multiple receivers can utilize triangulation (or the like) to determine the source of a transmission. Other means to determine position similar to the sensing of surface acoustic waves (SAWs) on a touchscreen display could be utilized, or sensors which utilize phased-array or lens-coupled antenna methods, wherein one or more receivers senses the reflected signal(s) resulting from the change in impedance caused by the incident ion. One major advantage of antenna coupling is reduced sensor thermal mass, and thus a reduction in cryogenic requirements.

Figure 2:
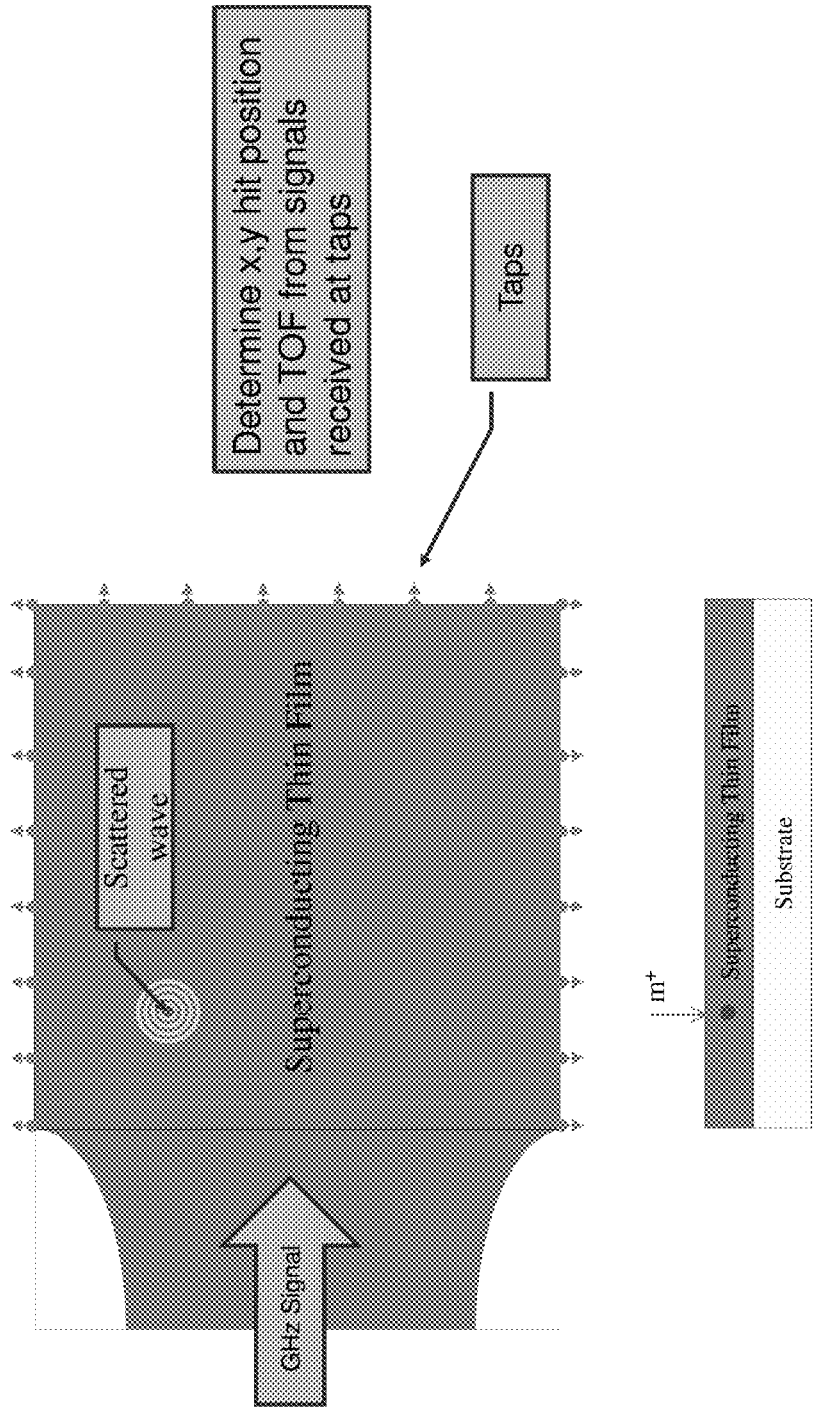
FIG. 2 is a partially schematic representation of a Superconductor Detector in a bulk configuration with an incident ion creating a scattered wave.

In another version of the invention, ports could be used to connect High Electron Mobility Transistors (HEMTs) or other suitable amplifiers to taps on the SD. The impedance mismatch created by the formation of the quasiparticles by the incident ion can induce reflected and transmitted signals in the SD, which are then sensed by the HEMT(s) and processed electronically to determine, for example, the direction of arrival (DOA) of the incident signals, and thus the location of the ion 'hit' on the SD. To illustrate, a signal—e.g., a 10 GHz microwave signal—could be coupled to a bulk SD (FIG. 2). An incident ion will then create quasiparticles, resulting in a localized impedance change which in turn creates transmitted and reflected signals. With no incident ion(s), all sensed signals are equal—they are that of the coupled signal. When ion-induced quasiparticles are created, the sensed signals are not equal, and the real and/or imaginary components of the signals can be processed to determine the location of the incident ion. Further, if only quasiparticles are formed, and no "normals" (normal mode regions) are formed, then the signal amplitude varies linearly with energy (and additionally, the response time of the detector is much faster in this case). Some termination may be required at each port to improve the coupling of the signal to the amplifiers. Directional couplers may be utilized.

One or more timers could be started with each excitation pulse, and stopped when the signal from the SD is sensed. The signal from each port can be used to calculate a time stamp. The time stamp will include the TOF for the incident ion plus some propagation delay as the induced signal travels from the ion strike location on the detector to the sensing means. There may be further propagation delays through any processing electronics. Depending on the desired accuracy, these propagation delays can be subtracted from the timestamp(s) to calculate the actual TOF. Another method could include calculating the average of the timestamps and using this to determine TOF for the ion. Further, the position that the ion impacts the detector can be interpolated from the timestamps: if all timestamps are equal, then the ion hit the center of the detector, whereas offsets in timestamps (e.g., between two opposite sides of the detector) can indicate off-center hits. The interpolated position from the timestamps may be used, in addition to other position determination mechanisms from the detector, to help pinpoint and sort the locations of multiple (near) simultaneous hits and thus improve multihit discrimination.

In another version of the invention, the signal could induce a voltage change in an intermediate material, and this signal is used to determine position. For example, a SD comprised of a layer of NbN could induce a charge in an array comprised of MgO deposited on an insulator, such as glass. This signal could be amplified and detected.

In another version of the invention, the incident ion can induce a regional change in the conductivity of the SD that can be proportional to the incident ion's kinetic energy. As stated earlier, measuring the amplitude, magnitude or the like of this regional change can provide insight into the mass of the incident ion. One example would involve the use of an amplifier/discriminator combination as sent on the left side of FIG. 2. An application-specific integrated circuit (ASIC) or some other processor can be utilized to determine the kinetic energy as well as the TOF of the detected ion.

It should be noted that while niobium nitride (NbN) is often noted in this document as the preferred superconductor, other materials could suffice. The use of Nb is well documented in the literature, and operation at temperatures from 4 to 5 Kelvin is common. Higher temperature superconducting materials such as NbTiN may also be utilized with appropriate compensation for noise, response time, sensitivity and other parameters.

Once ion strike position on the detector is determined, the original position of the incident ion within the specimen may be determined by "back projecting" the detected position onto the original specimen form.

Figure 7:
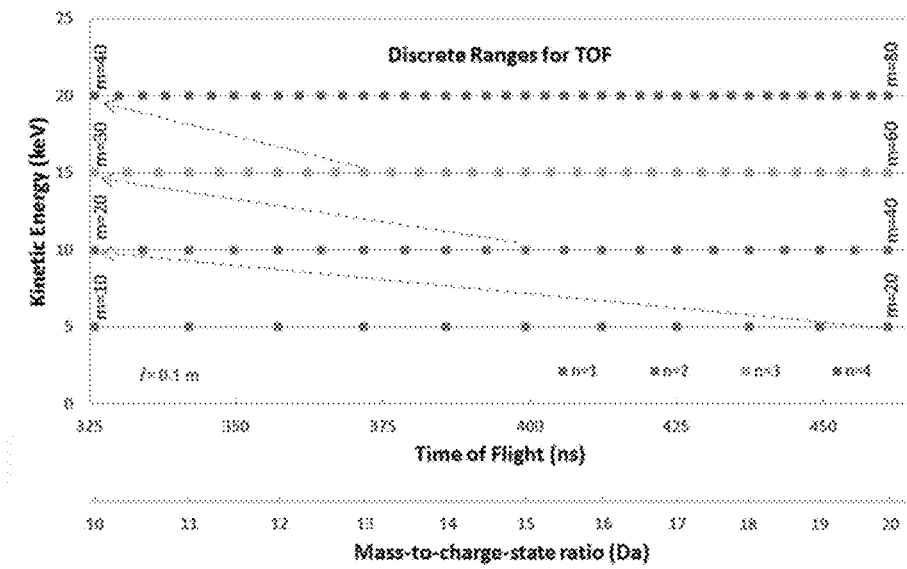
FIG. 7 is a graph of a simulated mass-energy spectrum for all masses in the range $10 \leftarrow m/n \leftarrow 20$.

Preferred versions of the invention also have detectors which detect the (kinetic) energy of incoming ions. The operating space for traditional time-of-flight spectrometry may be described as a one-dimensional mass spectrum. When kinetic energy information is provided as well, this operating space becomes a two-dimensional mass-energy spectrum, or m-KE spectrum. FIG. 7 shows a simulated spectral operating space for the hypothetical atom probe of FIG. 3 for the time range of 325 to 470 ns and mass-to-charge-state ratio range of 10 to 20 Da. Without kinetic energy information, the one-dimensional mass spectrum of all possible peaks would simply be the projection of all the points in FIG. 7 onto the abscissa. In the mass-energy operating space, high resolving power is needed to separate isotopes in time, $t/\Delta t$, but only modest resolving power is needed for kinetic energy, $KE/\Delta KE$.

Figure 4:
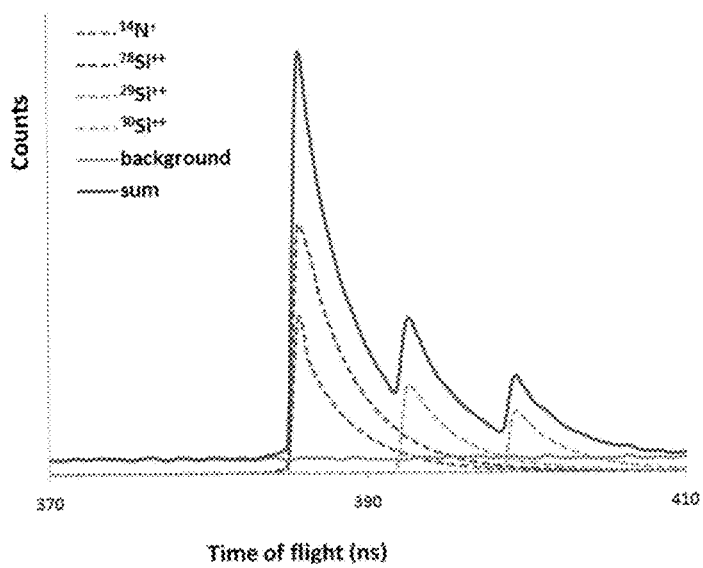
FIG. 4 is a graph of a segment of a of a simulated TOF mass spectrum with three peaks.
Figure 5:
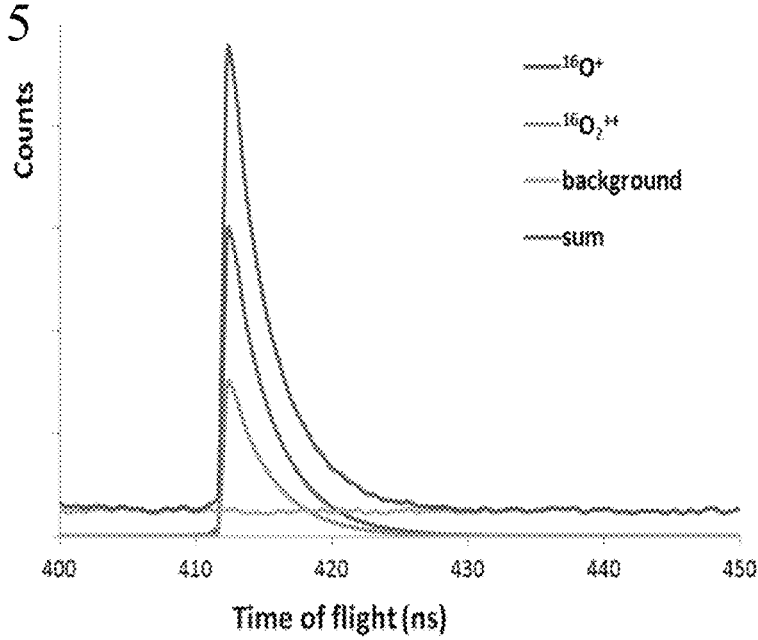
FIG. 5 is a graph of a segment of a simulated TOF mass spectrum corresponding to O16+ and O16++.
Figure 6:
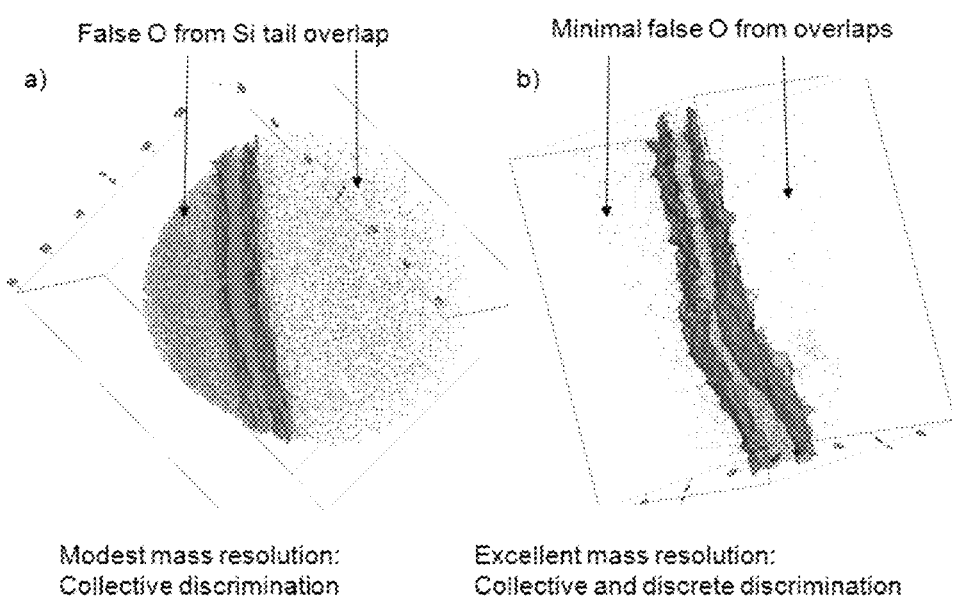
FIG. 6 is a schematic illustration of the importance of good discrete ion discrimination in an APT data set.
Figure 13:
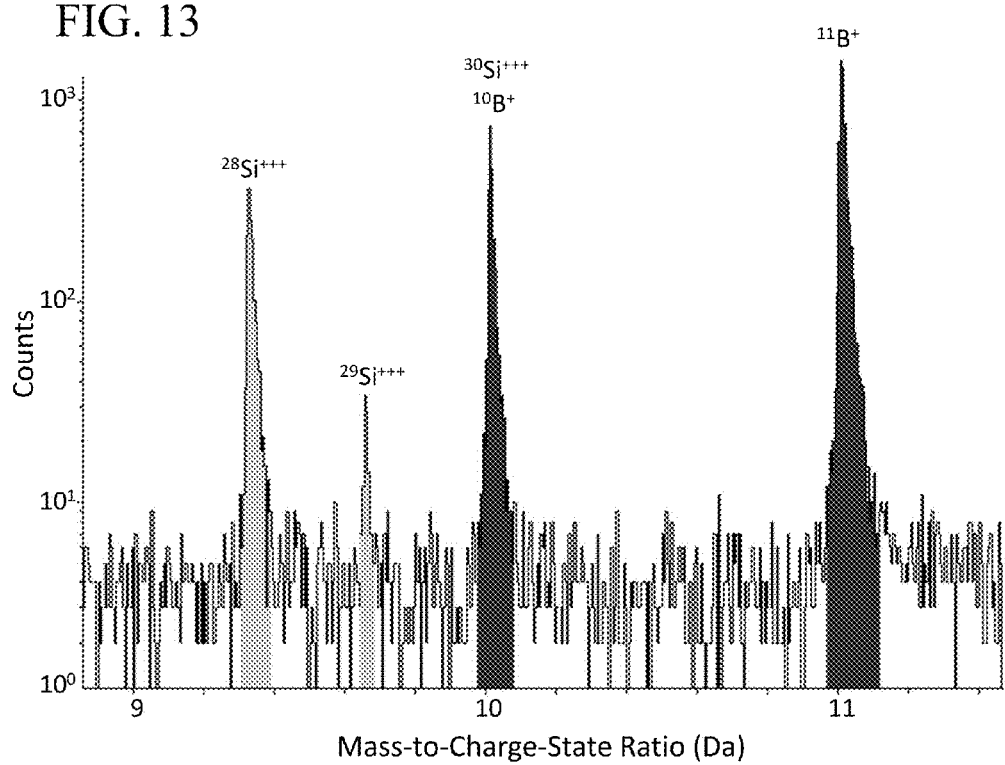
FIG. 13 is a graph of a mass spectrum of a boron-implanted silicon specimen obtained with a laser pulsed atom probe.

Because kinetic energy is indicative of charge state, measurement of the kinetic energy of an incident ion can be used to determine the elemental identity of the incident particle (i.e., the atoms or molecules from which the particle was formed), when used in conjunction with the relative mass-to-charge-state ratio (m/n). The m/n can be ambiguous in the case where heavier ions with higher charge states can have the same time-of-flight (TOF) as lighter ions with lower charge states. For example, m+ will have the same relative m/n (hence the same TOF) as 2 m++(where m is the mass of the particle), but the isotope m (e.g. $^{14}$N) and isotope 2m (e.g. $^{28}$Si) are unique. Similarly, the monatomic ion specie, $^{16}O^+$, and the polyatomic ion specie, $^{16}O_2^{++}$, have the same m/n (hence the same TOF), but should be counted differently when determining composition. Another example is given in FIG. 13, which illustrates a mass spectrum taken from an implanted region in a boron-implanted silicon semiconductor with low levels of boron. There is a large separation between the $^{11}B^+$ and the $^{28,29}Si^{+++}$ peaks, but the $^{10}B+$ and $^{30}Si+++$ peaks have significant interference.

Where the detector is capable of providing kinetic energy measurement, the energy sensitivity of the detector can be used to discern the difference between isotopes (e.g., m and 2 m++), and to resolve spectrum peak ambiguity (FIGS. 4 and 13), as well as to discern between monatomic and polyatomic ions of the same species based on the kinetic energy of the incident ion (FIG. 5). In classical mechanics the kinetic energy (KE) of a particle of mass m and velocity v is:

$$KE=\tfrac{1}{2}mv^2 \qquad \text{(Equation 1)}$$

When an ion is accelerated through a potential, the kinetic energy gain is equal to its change in potential energy, neV. Thus:

$$KE=\tfrac{1}{2}mv^2=neV \qquad \text{(Equation 2)}$$

Since e is a universal constant (elementary charge) and voltage V is known experimentally (for each detected ion), a measurement of KE gives n. A first order analysis of the kinematics of an atom probe can be obtained by assuming that the flight speed of an ion is constant throughout its flight. In this case v=L/t, where t is TOF and L is the flight path length, and Equation 2 can be solved for m/n:

$$m/n=2\,eV(t/L)^2 \qquad \text{(Equation 3)}$$

Since the TOF gives m/n, we obtain m unambiguously. Measurement of t for known V and L thus yields the ion mass-to-charge-state ratio. The mass resolving power is a measure of the ability to distinguish a single mass or different masses in a spectrum and is defined as:

$$m/\Delta m=\tfrac{1}{2}t/\Delta t \qquad \text{(Equation 4)}$$

The uncertainties in time-of-flight measurements, $\Delta t/t$, dictate the mass resolving power. From Equation 2, if the kinetic energy of an ion in this apparatus is measured, then the charge state of the ion may be determined:

$$n=KE/eV \qquad \text{(Equation 5)}$$

Since e and V are constants for any given measurement, the charge-state resolving power is simply:

$$n/\Delta n=KE/\Delta KE \qquad \text{(Equation 6)}$$

The uncertainty in measurement of kinetic energy directly determines the ability to discriminate charge states. Since n is an integer value typically between 1 and 4 inclusive, modest charge-state resolving powers of 10 or less will be sufficient to discriminate among the few possibilities in atom probe tomography. Discriminating noise from data or accounting for energy deficits in voltage pulsing however, may benefit from higher kinetic-energy resolving power of 100 or so as discussed below. Note that high voltage ripple and voltage correction imprecision, $\Delta V$, do become a significant factor in limiting the mass resolving power when time-of-flight information is used, but in practice it is too small to be a factor in kinetic energy discussions.

Two ions with the same TOF have the same velocity, nearly the same flight distance, but can have twice the mass difference (m vs. 2m). It is clear that the ion with twice the mass will have twice the kinetic energy and should generate a larger signal in the superconductor (SD), hence Si++ should induce a larger signal than N. The signal may be level discriminated, integrated, digitized or the like to determine the amplitude, magnitude or other parameter indicative of the difference in signals generated by the two different particles.

Another advantage resulting from kinetic energy measurement involves the ability to "qualify" valid data. Presently, data acquired by an atom probe includes detected hits that are not correlated to excitation energy pulses. Some of these hits result from ions originating from the specimen (both adsorbed and intrinsic), and others from the non-ideal vacuum level within the analysis chamber itself. The net result is a background level of noise events that degrade the signal quality and decrease mass resolution.

At a given TOF, there are only discrete KE values that can correspond to a particle of mass m that has traversed the distance from the specimen to the detector in the measured TOF. Outside of these narrow ranges (narrowness depends on the energy resolution), the arriving particle will not have evaporated during the initiating pulse, i.e., it will be noise rather than "valid data." The ability to discern between signal and noise provides a valuable noise reduction mechanism for APT and other TOF measurement instruments. Thus, the use of kinetic energy measurement in an atom probe offers superior performance by reducing both peak ambiguities and noise.

In one version of the invention, the relative kinetic energy of the detected ions is compared to the range of TOF values. A subset of valid data can be determined from the intersection of the range of allowable kinetic energies and the range of allowable m/n (hence TOF) values (FIG. 7). Allowable KE ranges and allowable TOF ranges are a function of the mass of the particle and the charge state (both integer values), and of the sensitivity of the detection system (including accuracy and precision limits). Other factors that influence TOF measurements include high voltage supply stability, ripple, noise, the thermal effects of pulsing and the like. These subsets of valid data create regions of qualified data. Detector hits that do not fall within these qualified data regions can be excluded from further analysis, resulting in both an improvement in hit discrimination (FIG. 8) and improved data reconstruction results.

In addition these data subsets present a number of performance advantages including (but not limited to) reduced data array size, reduced analysis times and the allowance of larger data sets to be analyzed on a given computer system. For example, if the data can be stored in integer values instead of a combination of integer and floating point values, then less memory can be used to store a given analysis data set. Further, if an array is constrained to only integer values then the data can be analyzed much faster. This may seem trivial since at the time of this writing, 64 bit personal computers with gigabytes of RAM and terabytes of hard disk storage are common, but when one considers analyzing multi-billion ion data sets then every performance improvement can be significant—especially at the fundamental data array level.

Furthermore, when performing APT, one could intentionally increase the "background" gas pressure in the system (i.e., introduce a small amount of gas into the specimen chamber). This will increase the occurrence of field ionization of the gas, a process that is not synchronized with excitation pulsing. The atom probe could therefore also acquire a field ion microscopy (FIM) image during an APT run and filter/subtract it out from the pulse-correlated data. This FIM image can provide specimen shape and size information, crystallographic information, and the like. In addition, a modest increase in gas pressure often improves specimen yield, but was previously not useful in APT because it resulted in an unacceptable level of noise.

Figure 3:
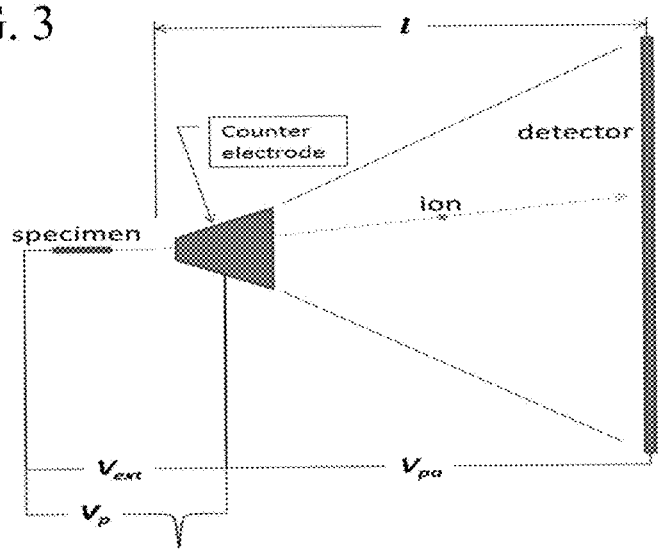
FIG. 3 is a schematic representation of the geometry of a typical atom probe.

A common problem with atom probe analyses is out-of-pulse evaporation events, which are sometimes called unidentified flying objects (UFOs). These are field evaporation events from the specimen which occur between pulses in an APT, and the ion arrives at the detector at a time that is not correlated with a start time. These ions may be intrinsic or extrinsic, and being from the specimen, they are not simply noise. These ions become part of the background in standard practice in an APT. Out-of-pulse evaporation usually happens preferentially for one or more atomic species. When preferential out-of-pulse evaporation occurs, the composition determination for that specie will be adversely affected. Ions that evaporate during pulses are time-correlated events and are referred to here as identified flying objects (IFOs). They too may be intrinsic or extrinsic ions. It is important to distinguish specimen ions from the noise that is inevitably present in any experiment, and when kinetic energy determination is incorporated in an atom probe, one can obtain information about UFOs. A distinction must be made between the cases of dynamic and static accelerating fields. Referring to FIG. 3:

$$V = V_{ext} + V_{pa} + V_p \quad \text{(Equation 7)}$$

where $V_{ext}$ is an extraction voltage used with both static and dynamic fields, $V_{pa}$ is a post-acceleration voltage that can range in value from zero to magnitudes comparable to or greater than $V_{ext}$, and $V_p$ is a voltage pulse that is the time-varying component of dynamic fields. For this discussion, $V_{pa}$ is taken to be zero for simplicity. The pulse fraction, $f_p$, is defined as the fraction of the total voltage that the voltage pulse amplitude represents [Miller 2000]:

$$V_p = f_p V \quad \text{(Equation 8)}$$

Figure 8:
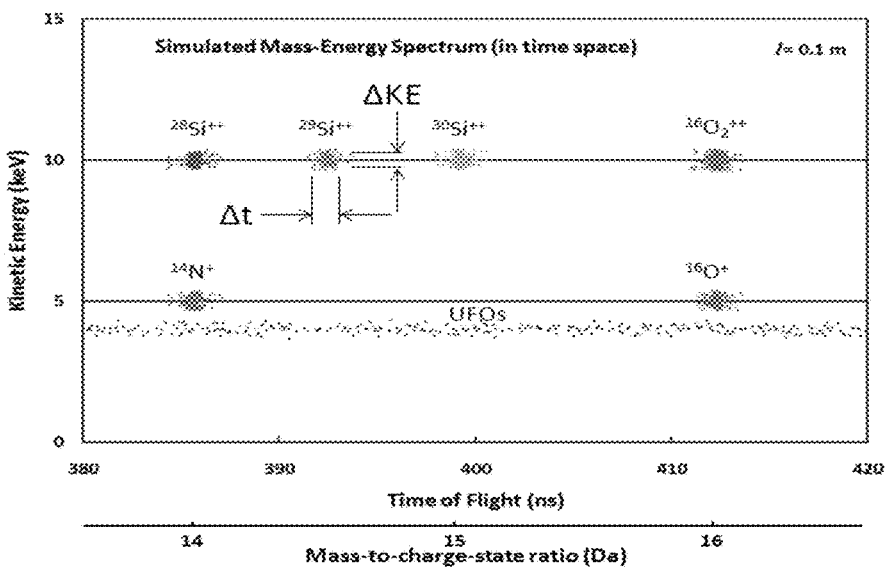
FIG. 8 is a graph of a simulated mass-energy spectrum.

For the case of a dynamic field (e.g., voltage pulsing or combined laser plus voltage pulsing), all time-correlated ions should be created near the peak of the voltage pulse, V, with a small variability in kinetic energy of a few percent. To a first approximation then, the kinetic energy of time-correlated ions in voltage-pulsed instruments is given by Equation 1 with V given by Equations 7 and 8. Out-of-pulse ions will have kinetic energy that corresponds to the standing voltage, $(1-f_p)V$. This value is typically 70 to 90% of the peak voltage during a pulse, depending on $f_p$, and therefore out-of-pulse ions and time-correlated ions may be separated by kinetic energy discrimination. Thus kinetic energy discrimination would make it possible to filter out UFOs from IFOs in a dynamic-field instrument as shown in FIG. 8. Note that UFOs are shown with n=1 only in FIG. 8, but the same effect applies to higher charge states.

Figure 10:
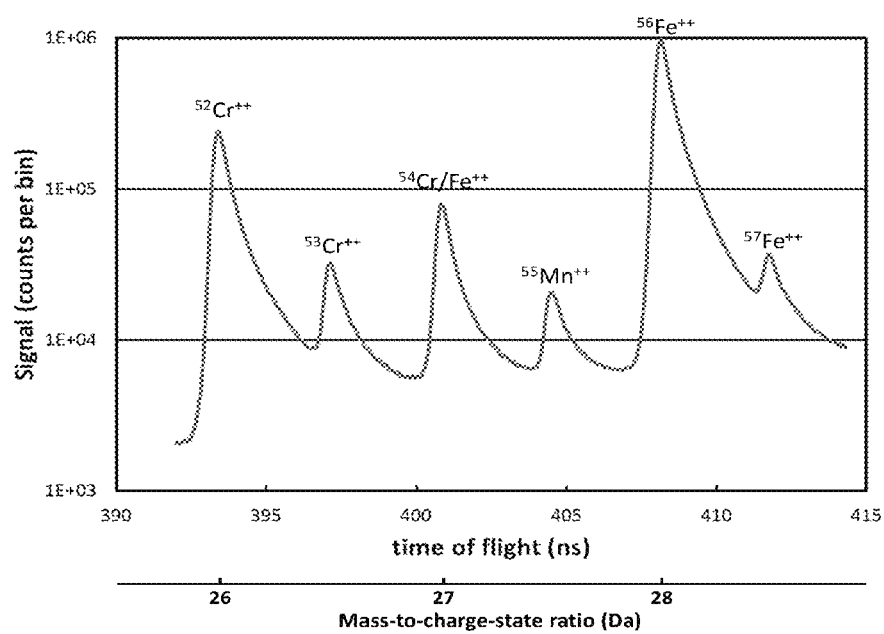
FIG. 10 is a graph of a mass spectrum from a stainless steel specimen obtained with a Local Electrode Atom Probe (LEAP) instrument.

Further, voltage pulsing generally leads to ion energy spreads of about 1% because the field evaporation process occurs in a time-varying electric field. This energy spread limits mass resolving power for uncompensated voltage pulsing to values of 200 or so. Reflectron energy compensators have been used to equalize the flight times for like ions with these energy spreads to achieve mass resolving powers of 1200 and greater. The local electrode atom probe (LEAP) geometry [Kelly et al. 2004] reduces but does not eliminate this effect in a straight-flight-path geometry like FIG. 3 to achieve mass resolving powers of 400 and greater. An example of a mass spectrum of a stainless steel taken with the LEAP geometry is shown in FIG. 10. The mass resolving power, measured at full-width-half-maximum (FWHM), is about 400. The tails on the peaks are a visible effect of energy deficits in the voltage pulsing. It should be possible to discern this effect in a mass-energy spectrum. The actual mass spectrum of FIG. 10 has been simulated in FIG. 11 with a kinetic energy resolving power of 275. Though each of the peaks in FIG. 10 overlaps with tails of peaks located at shorter times of flight, the mass-energy spectrum reveals unique ion clusters. Here again, transforming from a one-dimensional TOF (m/n) spectrum to a two-dimensional spectrum of TOF (m/n) and KE enables separation of the data into distinct regions of the two-dimensional space and discrimination becomes straightforward.

Figure 11:
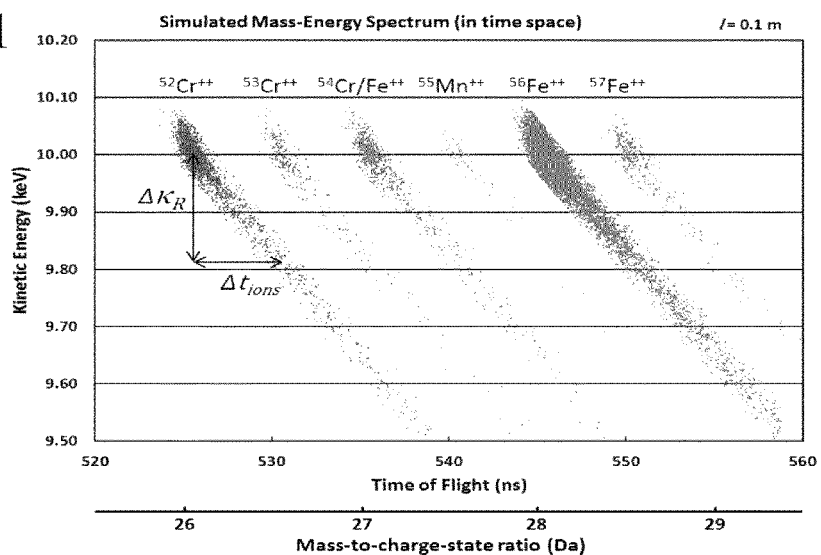
FIG. 11 is a graph of a simulated mass-energy spectrum for the ion spectrum peaks shown in FIG. 10.

Instead of a series of peaks collapsed onto the time axis, FIG. 11 shows peaks that are tilted in TOF-KE space such that they do not interfere. Steeper slope in this figure improves the ability to discriminate the individual peaks. Combining Equations 1 and 3 and taking the derivative gives the slope of the peak on the TOF-KE spectrum:

$$d\text{KE}/dt = -2\text{KE}/t = -2qeV/t \quad \text{Equation 9}$$

for constant ion speed, i.e., v=L/t, as above. The slopes of these lines all appear to be the same since they are all at the same kinetic energy and only slightly different flight times. The slope depends on the charge state for a given flight time so that n=4 peaks are more sloped than n=1 peaks. It is not possible for peaks to cross since peaks of different n will reside at very different KE.

Figure 12:
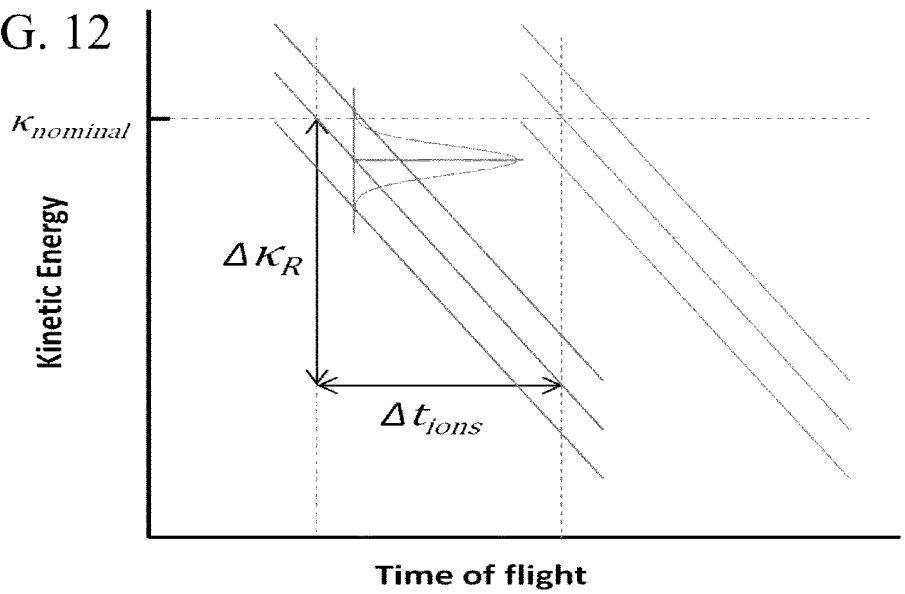
FIG. 12 is a schematic illustration of two ranges of ions used to derive the kinetic energy resolving power requirement for peak discrimination in voltage pulsing.

The kinetic energy resolving power necessary to fully separate peaks in voltage pulsing can be determined from the schematic in FIG. 12. If the kinetic energy determination has a Gaussian spread, then the peaks will be separated fully at the three-sigma level (99.7%) if their kinetic separation just vanishes at three sigma. Referring to FIG. 12, this can be stated as:

$$\Delta\text{KE}_R = w\Delta\text{KE}_{FWHM} \quad \text{Equation 10}$$

where $\Delta\text{KE}_R$ is the kinetic energy difference required for discrimination, $\Delta\text{KE}_{FWHM}$ is the full width at half maximum of the measured kinetic energy distribution, w (=2.55) is the scaling relationship between the full width at half maximum of a Gaussian distribution (=2.35σ) and full width at three-sigma separation (σ being the standard deviation). σ is a peak half width, and full width at three sigma is six sigma, so six-sigma peak width=6σ×(FWHM/2.35σ)=2.55FWHM. Lesser or greater separation criteria can be realized with different values of w. From FIG. 12, $$\Delta\text{KE}_R = d\text{KE}/dt_{ions} \quad \text{Equation 11}$$

Using the full width at half maximum of the measurement, the kinetic energy resolving power required to discriminate peaks in voltage pulsing may thus be determined from Equations 9, 10, and 11, $$KRP_{VP} = \text{KE}/\Delta\text{KE}_{FWHM\text{-}VP} = wt/2\Delta t_{ions} = w(m/n)/\Delta(m/n)_{ions} \quad \text{Equation 12}$$

where the negative sign has been dropped for this analysis as unnecessary. Note that the $KRP_{VP}$ for discriminating voltage pulsing is independent of the slope of the peak. This is because the slope and the kinetic energy both change as the charge state and these effects cancel. The required kinetic energy resolving power is simply inversely proportional to the time or mass separation of the ions at a given mass.

If we calculate the three-sigma KRP for the data in FIG. 10 using Equation 12 at m/n=26 and using $\Delta(m/n)_{ions}$=0.5, the value is 133. This matches well the observation from the simulation in FIG. 11 that the KRP used, at 275, is about twice that required to achieve full separation of the peaks.

With a capability for KRP in excess of 100, it would be possible to build voltage-pulsed atom probes without reflectron compensators. A single short-flight-path geometry like FIG. 3 would work well for both voltage pulsing and laser pulsing. It would offer large field of view, high repetition rate capability (due to the short flight path length and thus short flight times), and excellent peak discrimination. The energy-deficit correction would be performed with information from the detector. This would eliminate the drawbacks associated with reflectron compensators; a) reduced detection efficiency associated with a mesh used to define the electrostatic potentials on the entrance and exit of the reflectron, b) mass resolving power limitations associated with microlensing effects from the mesh, c) reduced data collection rates (about 5 times) due to the greater flight path length in a reflectron system, and d) non-uniform mass resolving power performance laterally across the face of the detector.

For the case of a static field (e.g., laser pulsing), all ions whether pulse-timed or not, are accelerated through the same V. The small effect of thermal energy from the laser pulse is insignificant. Hence all ions of the same charge state arrive with the same kinetic energy, which also corresponds to the kinetic energy of the IFOs. In general, kinetic energy information will hot help with UFO discrimination when static fields are used. However, if some UFOs have a different n (e.g., n=2) from others (e.g., n=1) and there is reason to believe that one of these, say n=2, is a known type of ion, then all n=2 ions in the background could be attributed to the specie in question.

Figure 9:
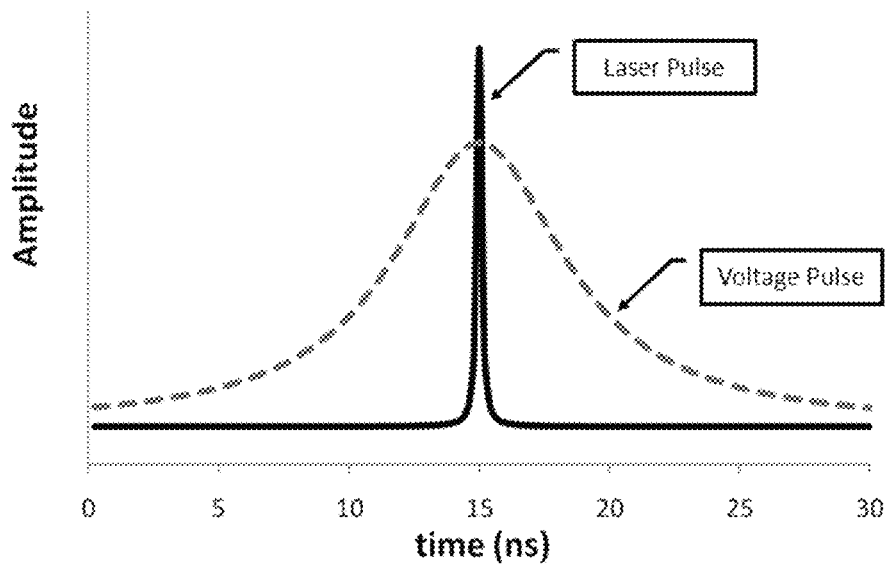
FIG. 9 is a graph of a laser pulse synchronized with a voltage pulse.

Furthermore, laser pulsing could be performed with a dynamic field as follows. FIG. 9 shows a synchronized laser pulse and voltage pulse schematic. Consider the case where the standing voltage during laser pulsing experiments is held at (for example) 80% of that required for dc evaporation, and additional voltage is applied in a slow (e.g., 10 to 50 ns) voltage pulse. If the maximum field achieved is still less than needed to induce sensible evaporation and a synchronized laser pulse is used to achieve the final increment in evaporation rate necessary to effect the desired events, then several benefits accrue. The out-of-pulse evaporation probability could be reduced well below that used in either current voltage pulsing or laser pulsing experiments with the corresponding reduction in background and improvement in composition determination. Laser analysis of challenging materials like GaN, for which it is difficult to achieve adequate effective pulse fractions [defined in Bunton et al. 2007], would be markedly improved because this effectively increases the pulse fraction. The kinetic energy of in-pulse ions would be greater than out-of-pulse ions by the ratio of total voltage to standing voltage. This would enable background filtering where laser pulsing is used. The voltage pulse would have to be long enough that poor electrical conductors could support the propagation of the pulse to the tip. However, it would be best to keep the voltage pulse as short at possible because the background reduction will depend on the ratio of the pulse duration to pulse repetition period. The best combination of laser amplitude, standing voltage, and voltage pulse amplitude will depend on material properties such as individual evaporation fields, electrical conductivity, and thermal diffusivity and experimental conditions like base temperature.

Another key technical challenge with position-sensitive detectors is discrimination of multiple hits that are closely positioned in either space or time. Atom probes tend to produce events that are spaced closely in both space and time (two identical ions evaporate from adjacent atomic positions nearly simultaneously). Though existing position-sensitive detectors do a reasonable job of sorting multiple hits from single hits, they are far from perfect, and kinetic energy information could help. If two simultaneous events (within the timing precision of the instrument) hit close to each other on a detector, they may be outside of the detector's ability to discriminate and a single hit would be erroneously reported. The kinetic energy deposited, however, will be twice that of a single hit. Utilization of kinetic energy information could thus augment the information from position-sensitive detectors and may shed new light on the physics of the field evaporation process.

While the foregoing discussion is focused on atom probes, one skilled in the art will understand that many of the underlying principles are equally applicable to TOF mass spectrometers in general, as well as other particle detection techniques. Further, while use of a superconducting detector was emphasized, other particle detectors and amplifiers might be utilized, including (but not limited to) enhanced MCPs, micro-particle plate amplifiers (MPPs, e.g. silica spheres, MgO or $Al_2O_3$), and other detectors and/or amplifiers.

The invention is not intended to be limited to the exemplary versions of the invention described above, but rather is intended to be limited only by the claims set out below. Thus, the invention encompasses all different versions that fall literally or equivalently within the scope of these claims.

What is claimed is:

1. A method including the steps of:
   a. inducing ionization of atoms from a specimen,
   b. detecting the kinetic energies of the ionized atoms at a detector having an area spaced from the specimen;
   c. measuring the times of flight of the ionized atoms between the specimen and the detector;
   d. identifying the elemental identities of at least some of the ionized atoms from their times of flight and kinetic energies.

2. The method of claim 1 further including the steps of:
   a. detecting the arrival locations of the ionized atoms on the area of the detector, and
   b. deriving, from the arrival locations, the locations on the specimen from which the ionized atoms originated.

3. The method of claim 1 wherein the step of identifying the elemental identities of at least some of the ionized atoms includes:
   a. for ionized atoms having times of flight and kinetic energies corresponding to elemental species, assigning the elemental identities of the elemental species;
   b. for ionized atoms having times of flight and kinetic energies which do not correspond to elemental species, treating the ionized atoms as noise.

4. The method of claim 1 further including the steps of:
   a. providing a non-ionized gas about the surface of the specimen, the gas having a composition different from that of the specimen, whereby gas ions are generated at the specimen's surface when inducing ionization of atoms from the specimen;
   b. detecting the kinetic energies of the gas ions at the detector;
   c. measuring the times of flight of the gas ions between the specimen and the detector;
   d. distinguishing the gas ions from ionized atoms from the specimen.

5. A method including the steps of:
   a. inducing ionization of atoms from a specimen during ionization periods spaced in time,
   b. at a detector having an area spaced from the specimen, obtaining measurements indicative of:
      (1) the kinetic energy of any ionized atoms, and
      (2) the time of flight of any ionized atom,
      the measurements being obtained following the ionization periods;
   c. determining groups of measurements having at least substantially the same times of flight and kinetic energies, thereby establishing a spectrum;
   d. at least partially determining the composition of the specimen from the spectrum.

6. The method of claim 5 further including the steps of:
   a. detecting the arrival locations of the ionized atoms on the area of the detector, and
   b. generating, from the arrival locations, a model of the spatial locations on the specimen from which the ionized atoms originated.

7. The method of claim 6 wherein the step of detecting the arrival locations of the ionized atoms on the area of the detector includes:
   a. measuring signals obtained from spaced sides of the area of the detector subsequent to the ionization period,
   b. determining the ion arrival location on the area of the detector from the timing of the signals.

8. The method of claim 6 wherein the step of detecting the arrival locations of the ionized atoms on the area of the detector includes:
   a. supplying a signal to the detector;
   b. measuring, from one or more sides of the area of the detector, any change in the signal after the ionization period;
   c. determining the ion arrival location on the area of the detector from the change in the signal.

9. The method of claim 5 further including the step of determining whether the spectrum includes measurements indicative of the simultaneous arrival of two or more ionized atoms at the detector, wherein:
   a. when a group of one or more measurements has:
      (1) times of flight which at least substantially match the times of flight of the measurements in another one of the groups, and
      (2) kinetic energies which are at least substantially the same as the sums of the kinetic energies of at least two of the measurements of one or more of the other groups,
   b. the group is decomposed into one or more subgroups of one or more measurements, each subgroup having:
      (1) the same times of flight as those in the group being decomposed, and
      (2) kinetic energies less than the kinetic energies in the group being decomposed.

10. A method including the steps of:
    a. supplying energy to a specimen, the energy being sufficient to ionize an atom from the specimen,
    b. providing a detector having an area situated to receive the ion from the specimen;
    c. measuring an output from the detector, wherein the detector output encodes:
       (1) the arrival time at which the ion is received on the detector,
       (2) the arrival location on the area of the detector on which the ion is received, and
       (3) the kinetic energy of the ion.

11. The method of claim 10 further including the steps of:
a. deriving the mass/charge ratio of the ion from the arrival time;
b. deriving the charge state of the ion from the kinetic energy;
c. determining groups of ionized atoms having at least substantially the same mass/charge ratios and kinetic energies, thereby establishing a spectrum;
d. at least partially determining the composition of the specimen from the spectrum.

12. The method of claim 10 further including the steps of:
a. deriving, from the arrival location, the location on the specimen from which the ion originated; and
b. deriving the identity of the ion from:
    (1) the arrival time, and
    (2) the kinetic energy.

13. The method of claim 10 further including the steps of:
a. deriving the mass/charge ratio of the ion from the arrival time;
b. deriving the charge state of the ion from the kinetic energy; and
c. deriving the identity of the ion from at least one of the mass/charge ratio and the charge state.

14. The method of claim 13 further including the step of deriving, from the arrival location, the location on the specimen from which the ion originated.

15. The method of claim 10 further including the steps of:
a. deriving the mass/charge ratio of the ion from the arrival time;
b. deriving the charge state of the ion from the kinetic energy; and
c. where the mass/charge ratio and the charge state do not both correspond to an ionized atomic species, treating the detector output corresponding to the ion as noise.

16. The method of claim 10 further including the steps of:
a. providing a non-ionized gas about the surface of the specimen, the gas having a composition different from that of the specimen, whereby gas ions are generated at the specimen's surface when energy is supplied to the specimen;
b. measuring an output from the detector corresponding to the gas ions;
c. distinguishing the gas ions from the ion from the specimen.

17. The method of claim 10 wherein the detector, upon receiving the ion from the specimen, generates a charge encoding the kinetic energy of the ion.

18. The method of claim 10 further including the steps of:
a. measuring, from multiple sides of the area of the detector, the times at which a signal is received from the ion arrival location;
b. determining the ion arrival location on the area of the detector from the measured times.

19. The method of claim 10 further including the steps of:
a. supplying a signal to the detector;
b. measuring, from one or more sides of the area of the detector, any change in the signal induced by the receipt of the ion on the detector;
c. determining the ion arrival location on the area of the detector from the change in the signal.

20. The method of claim 10 further including the step of cooling the detector to a superconductive state.

21. An atom probe including:
a. a specimen mount configured to:
    (1) receive a specimen thereon, and
    (2) supply energy to the specimen, the energy being at least partially sufficient to ionize atoms from the specimen;
b. a detector:
    (1) having an area situated to receive ions from the specimen, and
    (2) configured to provide a detector output encoding:
        (a) the arrival time at which the ions are received on the detector,
        (b) the arrival location on the area of the detector on which the ions are received, and
        (c) the kinetic energy of the ions.

22. The atom probe of claim 21 further including a local electrode situated:
a. closely adjacent the specimen mount, and
b. distantly from the detector.

23. The atom probe of claim 21 wherein the detector is superconducting.

24. The atom probe of claim 21 further including a processor configured to generate a spectrum, the spectrum including ions grouped by both the ions' arrival time and kinetic energy.

25. The atom probe of claim 21 further including a display configured to display a representation of the specimen generated from the detector output, the representation including:
a. elemental identities assigned to the ions, the elemental identities being dependent on the ions' arrival time and kinetic energy; and
b. locations of the ions within the specimen, the locations being dependent on the ions' arrival location on the area of the detector.

* * * * *